(12) United States Patent
Cooney et al.

(10) Patent No.: US 8,481,861 B2
(45) Date of Patent: Jul. 9, 2013

(54) METHOD OF ATTACHING DIE TO CIRCUIT BOARD WITH AN INTERMEDIATE INTERPOSER

(75) Inventors: Robert C. Cooney, Janesville, WI (US); Joseph M. Wilkinson, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 27 days.

(21) Appl. No.: 13/156,536

(22) Filed: Jun. 9, 2011

(65) Prior Publication Data

US 2011/0232952 A1 Sep. 29, 2011

Related U.S. Application Data

(62) Division of application No. 11/768,939, filed on Jun. 27, 2007, now Pat. No. 7,982,137.

(51) Int. Cl.
*H05K 1/09* (2006.01)

(52) U.S. Cl.
USPC ........... 174/257; 174/256; 174/258; 174/259; 174/260; 174/261; 174/262; 174/524; 174/527; 361/306.2; 361/306.3; 361/748; 361/751; 361/760; 361/767; 257/700; 257/712; 257/774; 257/777; 257/778; 257/780; 257/782; 228/5.5; 228/180.22; 428/209; 428/403; 438/108; 438/118; 438/460; 438/613; 29/830; 29/843; 29/846

(58) Field of Classification Search
USPC ................ 174/257, 256, 258, 259, 260, 261, 174/262, 524, 527; 361/306.2, 306.3, 748, 361/751, 760, 767; 257/700, 712, 774, 777, 257/778, 780, 782; 228/5.5, 180.22; 428/209, 428/403; 438/108, 118, 460, 613; 29/830, 29/843, 846

See application file for complete search history.

(56) References Cited

U.S. PATENT DOCUMENTS

| | | | |
|---|---|---|---|
| 3,795,047 A * | 3/1974 | Abolafia et al. | 29/843 |
| 4,074,342 A | 2/1978 | Honn et al. | |
| 4,548,451 A | 10/1985 | Benarr et al. | |
| 4,573,768 A * | 3/1986 | Polak et al. | 359/270 |
| 4,689,122 A * | 8/1987 | Polak et al. | 205/783 |
| 4,725,801 A | 2/1988 | Snyder | |
| 4,788,767 A * | 12/1988 | Desai et al. | 29/830 |
| 4,811,082 A | 3/1989 | Jacobs et al. | |
| 4,851,614 A | 7/1989 | Duncan, Jr. | |
| 4,855,763 A * | 8/1989 | Kan et al. | 347/152 |
| 5,136,471 A | 8/1992 | Inasaka | |
| 5,148,266 A | 9/1992 | Khandros | |
| 5,201,451 A * | 4/1993 | Desai et al. | 228/5.5 |

(Continued)

FOREIGN PATENT DOCUMENTS

JP 2003273315 3/2002

OTHER PUBLICATIONS

UK Search Report dated Sep. 11, 2008 for GB0808917.9.

*Primary Examiner* — Xiaoliang Chen

(74) *Attorney, Agent, or Firm* — Carlson, Gaskey & Olds P.C.

(57) ABSTRACT

A die having a base formed of a first material is connected to a board having a base formed of a second material. An interposer having a coefficient of thermal expansion intermediate coefficients of thermal expansion of the first and second materials is positioned between the die and the board.

10 Claims, 5 Drawing Sheets

U.S. PATENT DOCUMENTS

| | | | |
|---|---|---|---|
| 5,258,648 A | 11/1993 | Lin | |
| 5,394,609 A | 3/1995 | Ferguson et al. | |
| 5,485,039 A | 1/1996 | Fujita et al. | |
| 5,489,804 A | 2/1996 | Pasch | |
| 5,574,630 A | 11/1996 | Kresge et al. | |
| 5,635,767 A | 6/1997 | Wenzel et al. | |
| 5,672,548 A * | 9/1997 | Culnane et al. | 438/118 |
| 5,729,433 A | 3/1998 | Mok | |
| 5,785,799 A * | 7/1998 | Culnane et al. | 156/379.7 |
| 5,790,384 A | 8/1998 | Ahmad et al. | |
| 5,834,799 A | 11/1998 | Rostoker et al. | |
| 5,986,338 A | 11/1999 | Nakajima | |
| 6,036,508 A | 3/2000 | Anderson | |
| 6,052,287 A | 4/2000 | Palmer et al. | |
| 6,064,286 A | 5/2000 | Ziegner et al. | |
| 6,069,208 A * | 5/2000 | Novits et al. | 525/331.1 |
| 6,137,475 A * | 10/2000 | Ginn et al. | 345/161 |
| 6,175,158 B1 * | 1/2001 | Degani et al. | 257/777 |
| 6,175,160 B1 | 1/2001 | Paniccia et al. | |
| 6,211,633 B1 | 4/2001 | Jones | |
| 6,239,496 B1 | 5/2001 | Asada | |
| 6,281,046 B1 | 8/2001 | Lam | |
| 6,308,938 B1 * | 10/2001 | Futakuchi | 257/780 |
| 6,319,829 B1 | 11/2001 | Pasco | |
| 6,335,491 B1 | 1/2002 | Alagaratnam | |
| 6,376,769 B1 * | 4/2002 | Chung | 174/524 |
| 6,399,892 B1 * | 6/2002 | Milkovich et al. | 174/258 |
| 6,442,039 B1 | 8/2002 | Schreiber | |
| 6,444,921 B1 * | 9/2002 | Wang et al. | 174/260 |
| 6,477,034 B1 * | 11/2002 | Chakravorty et al. | 361/306.3 |
| 6,504,730 B1 | 1/2003 | Cooney | |
| 6,525,407 B1 | 2/2003 | Drewery | |
| 6,617,681 B1 | 9/2003 | Bohr | |
| 6,798,057 B2 | 9/2004 | Bolkin et al. | |
| 6,904,674 B2 | 6/2005 | Mune et al. | |
| 6,910,812 B2 | 6/2005 | Pommer | |
| 6,953,891 B2 | 10/2005 | Bolken et al. | |
| 7,233,061 B1 | 6/2007 | Conn | |
| 7,310,239 B1 | 12/2007 | Fjelstad et al. | |
| 7,415,762 B2 | 8/2008 | Fukase et al. | |
| 7,435,627 B2 | 10/2008 | Horton et al. | |
| 7,566,960 B1 | 7/2009 | Conn | |
| 7,691,669 B2 | 4/2010 | Horton et al. | |
| 7,727,872 B2 | 6/2010 | Wood et al. | |
| 2001/0002066 A1 | 5/2001 | Mita et al. | |
| 2001/0036711 A1 * | 11/2001 | Urushima | 438/460 |
| 2002/0041489 A1 * | 4/2002 | Fritz | 361/767 |
| 2002/0061401 A1 * | 5/2002 | Kokubo et al. | 428/403 |
| 2002/0081838 A1 * | 6/2002 | Bohr | 438/637 |
| 2002/0088116 A1 * | 7/2002 | Milkovich et al. | 29/846 |
| 2002/0118027 A1 * | 8/2002 | Routkevitch et al. | 324/694 |
| 2002/0132463 A1 * | 9/2002 | Urushima | 438/613 |
| 2003/0034564 A1 * | 2/2003 | Palanisamy et al. | 257/778 |
| 2003/0038381 A1 | 2/2003 | Bolken | |
| 2003/0038415 A1 | 2/2003 | Anderson et al. | |
| 2003/0042587 A1 | 3/2003 | Lee | |
| 2003/0129371 A1 * | 7/2003 | Urakawa et al. | 428/209 |
| 2003/0151137 A1 | 8/2003 | Asano et al. | |
| 2003/0164550 A1 | 9/2003 | Lee et al. | |
| 2003/0178229 A1 * | 9/2003 | Toyoda et al. | 174/261 |
| 2003/0180029 A1 * | 9/2003 | Garito et al. | 385/142 |
| 2003/0183950 A1 | 10/2003 | Bolken | |
| 2003/0230801 A1 | 12/2003 | Jiang et al. | |
| 2004/0079193 A1 * | 4/2004 | Kokubo et al. | 75/252 |
| 2004/0084781 A1 * | 5/2004 | Ahn et al. | 257/777 |
| 2004/0089471 A1 * | 5/2004 | Andoh et al. | 174/262 |
| 2004/0118824 A1 | 6/2004 | Burgess | |
| 2004/0128246 A1 * | 7/2004 | Takayama et al. | 705/41 |
| 2004/0145039 A1 | 7/2004 | Shim et al. | |
| 2004/0149479 A1 * | 8/2004 | Chiu et al. | 174/52.2 |
| 2004/0159462 A1 * | 8/2004 | Chung | 174/259 |
| 2004/0161949 A1 * | 8/2004 | Yadav et al. | 438/800 |
| 2004/0164421 A1 * | 8/2004 | Tellkamp | 257/772 |
| 2004/0201111 A1 * | 10/2004 | Thurgood | 257/782 |
| 2005/0017333 A1 | 1/2005 | Bohr | |
| 2005/0023033 A1 | 2/2005 | Saiki | |
| 2005/0034893 A1 | 2/2005 | McCall et al. | |
| 2005/0064707 A1 * | 3/2005 | Sinha | 438/667 |
| 2005/0101188 A1 | 5/2005 | Benham et al. | |
| 2005/0104196 A1 | 5/2005 | Kashiwazaki | |
| 2005/0178241 A1 | 8/2005 | Smith et al. | |
| 2005/0211464 A1 * | 9/2005 | Byun et al. | 174/259 |
| 2005/0212127 A1 | 9/2005 | Savastiouk et al. | |
| 2005/0213281 A1 * | 9/2005 | He et al. | 361/306.2 |
| 2005/0263868 A1 | 12/2005 | Aoyagi | |
| 2005/0266701 A1 | 12/2005 | Aoyagi | |
| 2005/0275420 A1 | 12/2005 | Colbert et al. | |
| 2005/0281008 A1 * | 12/2005 | He et al. | 361/748 |
| 2006/0035416 A1 | 2/2006 | Savastiouk et al. | |
| 2006/0057451 A1 * | 3/2006 | Okuzaki et al. | 429/42 |
| 2006/0062990 A1 * | 3/2006 | Gotoh | 428/317.9 |
| 2006/0090787 A1 * | 5/2006 | Onvural | 136/212 |
| 2006/0175699 A1 | 8/2006 | Lee | |
| 2006/0186384 A1 * | 8/2006 | Gerhardt et al. | 252/511 |
| 2007/0013392 A1 | 1/2007 | Kim et al. | |
| 2007/0096327 A1 * | 5/2007 | Kawamura et al. | 257/774 |
| 2007/0108591 A1 * | 5/2007 | Sunohara et al. | 257/700 |
| 2007/0132090 A1 * | 6/2007 | Kuwabara | 257/700 |
| 2007/0148421 A1 * | 6/2007 | Sohn et al. | 428/209 |
| 2007/0164270 A1 * | 7/2007 | Majumdar et al. | 257/14 |
| 2007/0194457 A1 * | 8/2007 | Ikegami et al. | 257/778 |
| 2007/0232090 A1 | 10/2007 | Colgan et al. | |
| 2007/0246840 A1 | 10/2007 | Chye et al. | |
| 2007/0254986 A1 * | 11/2007 | Tendou et al. | 523/440 |
| 2008/0029145 A1 | 2/2008 | Sung | 136/239 |
| 2008/0234409 A1 * | 9/2008 | Akagi et al. | 523/451 |
| 2008/0272484 A1 | 11/2008 | Myers et al. | |
| 2009/0062430 A1 * | 3/2009 | Ikezawa et al. | 523/400 |
| 2009/0247670 A1 * | 10/2009 | Hamada et al. | 523/450 |

* cited by examiner

METHOD OF ATTACHING DIE TO CIRCUIT BOARD WITH AN INTERMEDIATE INTERPOSER

RELATED APPLICATIONS

This application is a divisional of U.S. patent application Ser. No. 11/768,939, filed 27 Jun. 2007 now U.S. Pat. No. 7,982,137.

BACKGROUND OF THE INVENTION

This application relates to a method of attaching a die, such as a switch, made of a first base material to a circuit board made of a second base material. An interposer having a coefficient of thermal expansion intermediate the first and second materials is used to reduce thermal stresses.

Circuit boards are utilized in various control applications. As one example, modern aircraft have many printed circuit boards providing various control functions. One known circuit board has a die attached to the circuit board, to provide a control function. As an example, an FET (field effect transistor) may provide On/Off switch and circuit breaker functions to a circuit on the circuit board.

In many applications the circuit board has a base, such as a polymer base, while the attached die may have a silicon base. When the two are attached together, there is a good deal of thermal stress between the two due to their differing coefficients of thermal expansion. As an example, if the two are soldered together, the solder absorbs the differential expansion and may crack. It has sometimes been challenging to provide such an assembly that is able to withstand expected thermal expansion over a wide temperature range.

SUMMARY OF THE INVENTION

In a disclosed embodiment, an interposer material is positioned between the die and the circuit board, and is formed of a material having a coefficient of thermal expansion intermediate the coefficient of thermal expansion of the die and the material of the circuit board. The interposer also forms a conductive connection between the die and the circuit boards. In disclosed embodiments, various types of interposers may be utilized.

These and other features of the present invention can be best understood from the following specification and drawings, the following of which is a brief description.

DETAILED DESCRIPTION OF THE PREFERRED EMBODIMENT

Figure 1:
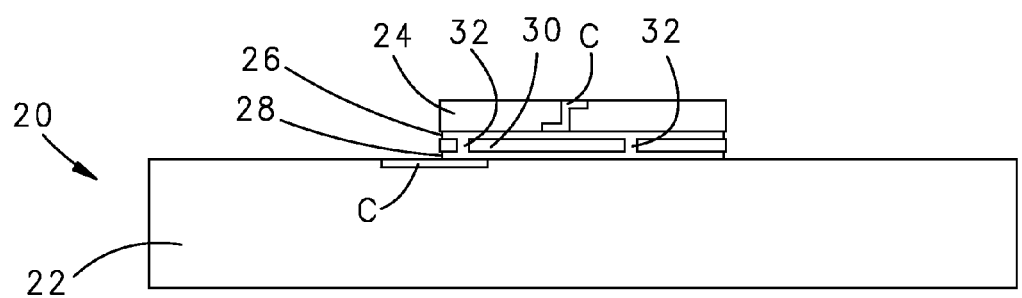
FIG. 1 is a cross-sectional view through a circuit board and connected die.

A printed circuit board assembly 20 is illustrated in FIG. 1 having a printed board 22 attached to a die 24. The die may be a field effect transistor, or some other type of solid state switch, and may provide a circuit breaker function to circuits on the printed board 22. Other switches and functions may also be used. The die 24 has a base of a first material along with circuit traces top and bottom, as known. The printed board 22 has a base of a second material, along with circuit traces. The particular disclosed embodiment has a silicon base die and a glass epoxy base printed board, but other materials may be utilized for the two members. The circuit traces are shown schematically at C and may be as known, to provide various functions.

The base materials for the die 24 and the printed board 22 are distinct, and have different coefficients of thermal expansion. As such, thermal stresses may exist at an interface between the two materials.

With the present application, a solder or other conductive material, such as a conductive adhesive is formed in one layer adjacent die 24, and another layer 28 adjacent the printed board 22. An intermediate material provides an interposer 30. Openings 32 within the material receive a conductive material to provide electrical connection between layers 26 and 28. The interposer 30 is selected to be of a material having a coefficient of thermal expansion intermediate that of the base materials of die 24 and the printed board 22. Thus, the thermal stresses between the die and printed board are reduced due to the interposer.

Figure 2:
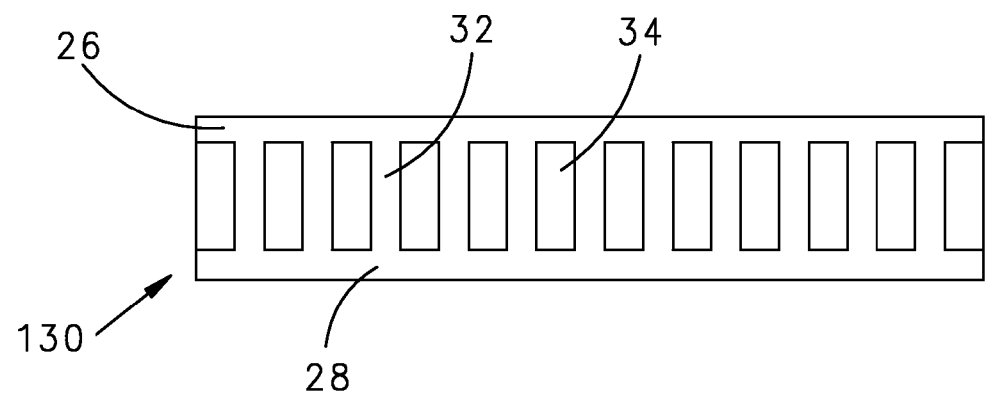
FIG. 2 shows a first embodiment interposer.

FIG. 2 shows a first embodiment interposer 130, wherein the layers 26 and 28 are connected by plated through holes 32 formed within the interposer material. The interposer material includes material 34, such that the thermal coefficient of expansion is intermediate that of the die 24 and the printed wiring board 22.

Figure 3:
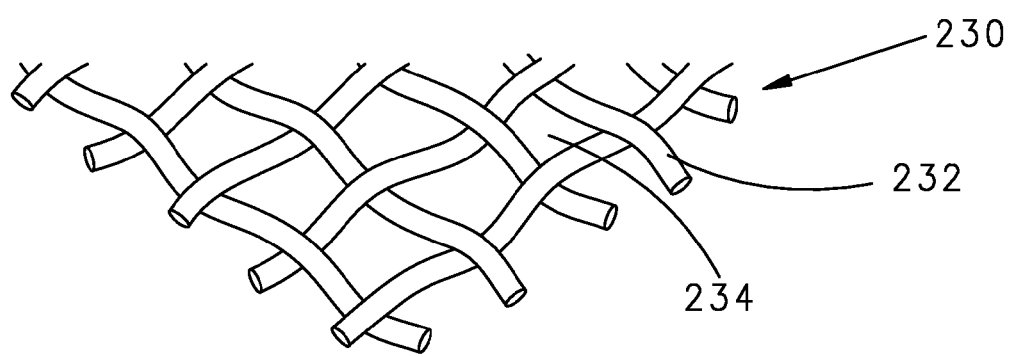
FIG. 3 shows a second embodiment interposer.

FIG. 3 shows another interposer embodiment 230 wherein a metal screen 232 is utilized. Solder or conductive adhesive flows through the openings 234 in the screen 232.

Figure 4:
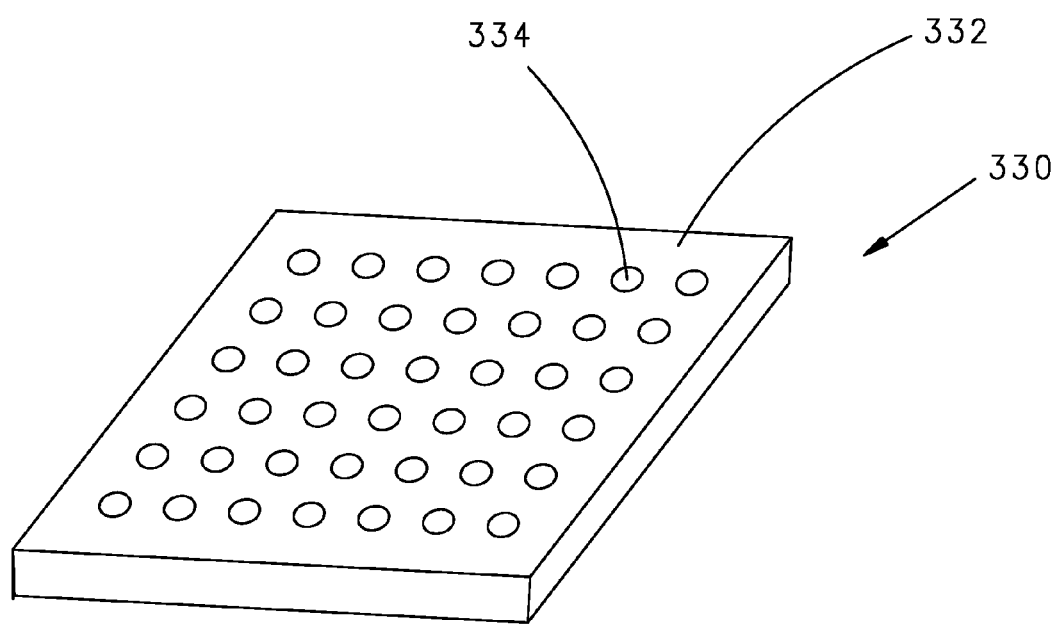
FIG. 4 shows a third embodiment interposer.

FIG. 4 shows another embodiment 330, wherein the interposer includes a material 332 formed with a plurality of holes 334. The holes are shown as round, but can be a plurality of shapes. Solder or conductive material flows through these openings to provide the electrical connections.

Figure 5:
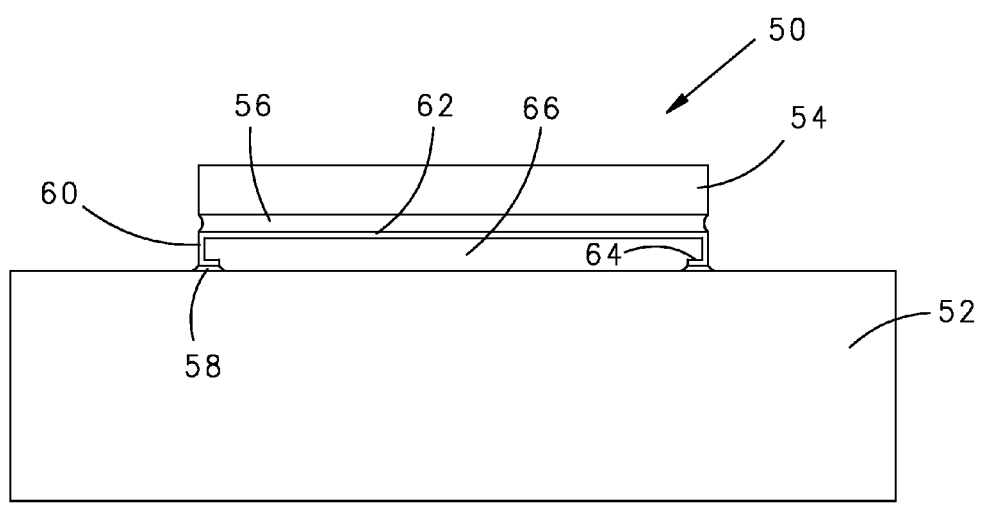
FIG. 5 shows a fourth embodiment interposer.

FIG. 5 shows another embodiment 50, wherein the printed board 52 is connected to the die 54 by an interposer 60. As shown, a conductive layer 58 is formed on the printed board 52, while a conductive layer 56 is provided adjacent the die 54. The interposer includes a back 62 in contact with the layer 56, and legs 60 which connect to the conductive portions 58 for the printed wiring board 52. The interposer itself is formed of a conductive metal to make the electrical connection. A space 66 is provided between the die 54 and the board 52 with this embodiment. This space can maximize the compliance between the printed wiring board 52 and the die 54. Other shapes can be utilized for the interposer.

The interposer can be made from any material having the coefficient of thermal expansion as mentioned above. One possible material would be a powdered metal injection molding compound. The process for forming materials from this compound could be optimized to obtain a specific coefficient of expansion. The porosity of this type material will allow the solder or other conductive type material to provide a superior electrical connection.

Another general type of material may be polyimide of bismuth telluride printed wiring board material. Again, an interposer would be plated on the top and bottom with plated through holes to provide an electrical connection between the top and bottom, such as shown for example in FIG. 2 above.

With all of the embodiments, it should be understood that the location of the conductive connection between the die and printed board, and through the interposer, is selected to provide appropriate electrical connections between the circuitry on the die and the printed board. The illustrations are a simplification of the actual likely connections.

Although embodiments of this invention have been disclosed, a worker of ordinary skill in this art would recognize that certain modifications would come within the scope of this invention. For that reason, the following claims should be studied to determine the true scope and content of this invention.

What is claimed is:

1. A printed circuit board comprising:
   a board having a substrate formed of a first material having a first coefficient of thermal expansion, and having circuit traces;
   a die secured to said board, said die having circuit traces electrically connected to said board circuit traces, and said die having a base formed of a second material having a second coefficient of thermal expansion different than said first coefficient of thermal expansion;
   an interposer material positioned between said die and said board, said interposer having an electrical connection connecting said die circuit traces to said board circuit traces, said interposer being formed of a third material having a coefficient of thermal expansion intermediate said first and second coefficients of thermal expansion;
   wherein said interposer includes a base material with a plurality of openings, said openings receiving a conductive material to connect said die to said board; and
   wherein said interposer is formed of a polyimide of bismuth telluride.

2. The printed circuit board as set forth in claim 1, wherein said base material includes a solid plate having said openings, with said conductive material extending through said openings to connect said die to said board.

3. The printed circuit board as set forth in claim 1, wherein said base material includes a metal screen, with openings in the screen allowing said conductive material to connect said die to said board.

4. The printed circuit board as set forth in claim 1, wherein said die is a switch.

5. The printed circuit board as set forth in claim 4, wherein said switch is a field effect transistor.

6. The printed circuit board as set forth in claim 1, wherein a first layer of conductive material is positioned between said interposer and said die, and a second layer of conductive material is positioned between said interposer and said board, with said connection extending through said interposer for connecting said first and second layers.

7. The printed circuit board as set forth in claim 6, wherein said first material is a glass filled epoxy.

8. The printed circuit board as set forth in claim 7, wherein said second material is silicon.

9. The printed circuit board as set forth in claim 1, wherein said interposer is formed of a powdered metal injection molding compound.

10. The printed circuit board as set forth in claim 1, wherein said conductive material is provided through said openings such that said conductive material directly contacts both said die and said board.

* * * * *